United States Patent
Bandiera (10) Patent No.: US 9,818,465 B2
(45) Date of Patent: Nov. 14, 2017

(54) SELF-REFERENCED MEMORY DEVICE AND METHOD USING SPIN-ORBIT TORQUE FOR REDUCED SIZE

(71) Applicant: Crocus Technology SA, Grenoble (FR)

(72) Inventor: Sebastien Bandiera, Corenc (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/022,766

(22) PCT Filed: Sep. 8, 2014

(86) PCT No.: PCT/EP2014/069082
§ 371 (c)(1),
(2) Date: Mar. 17, 2016

(87) PCT Pub. No.: WO2015/039912
PCT Pub. Date: Mar. 26, 2015

(65) Prior Publication Data
US 2016/0232958 A1  Aug. 11, 2016

(30) Foreign Application Priority Data

Sep. 19, 2013 (EP) ..................... 13290226

(51) Int. Cl.
*G11C 15/02* (2006.01)
*G11C 11/16* (2006.01)
(Continued)

(52) U.S. Cl.
CPC ........ *G11C 11/1673* (2013.01); *G11C 11/161* (2013.01); *G11C 11/1659* (2013.01);
(Continued)

(58) Field of Classification Search
None
See application file for complete search history.

(56) References Cited

U.S. PATENT DOCUMENTS

2008/0084724 A1* 4/2008 Nozieres ................ G11C 11/16
365/50
2012/0314488 A1  12/2012 El Baraji et al.
(Continued)

FOREIGN PATENT DOCUMENTS

EP  2626860 A1  8/2013

OTHER PUBLICATIONS

International Search Report for PCT/EP2014/069082 dated Jan. 9, 2015.
Written Opinion for PCT/EP2014/069082 dated Jan. 9, 2015.

*Primary Examiner* — Son Dinh
*Assistant Examiner* — Sultana Begum
(74) *Attorney, Agent, or Firm* — Pearne & Gordon LLP (57) ABSTRACT

A self-referenced MRAM cell comprises a first portion of a magnetic tunnel junction including a storage layer; a second portion of the magnetic tunnel junction portion including a tunnel barrier layer, a sense layer and a seed layer; the seed layer comprising a material having high spin-orbit coupling such that passing a sense current along the plane of the sense layer and/or seed layer exerts a spin-orbit torque adapted for switching a sense magnetization of the sense layer. A memory device comprising a plurality of the MRAM cells and a method for operating the memory device are also disclosed.

13 Claims, 8 Drawing Sheets

(51) Int. Cl.
*H01F 10/32* (2006.01)
*H01L 43/08* (2006.01)
*H01L 27/22* (2006.01)
*H01L 43/02* (2006.01)
*H01L 43/10* (2006.01)

(52) U.S. Cl.
CPC ...... *G11C 11/1675* (2013.01); *H01F 10/3254* (2013.01); *H01F 10/3286* (2013.01); *H01L 27/228* (2013.01); *H01L 43/02* (2013.01); *H01L 43/08* (2013.01); *H01L 43/10* (2013.01)

(56) References Cited

U.S. PATENT DOCUMENTS

2014/0084398 A1* 3/2014 Oguz ............... H01L 43/12
 257/421
2015/0200003 A1* 7/2015 Buhrman ............ G11C 11/18
 365/158
2016/0300614 A1* 10/2016 Nebashi ............. G11C 15/046

* cited by examiner

SELF-REFERENCED MEMORY DEVICE AND METHOD USING SPIN-ORBIT TORQUE FOR REDUCED SIZE

FIELD

The present invention concerns a self-referenced MRAM cell and a memory device comprising a plurality of the MRAM cells. The invention further concerns a method for operating the memory device.

DESCRIPTION OF RELATED ART

Self-Reference magnetic random access memory (MRAM) cells are read using an applied field generated by field lines. In that reading scheme, magnetization of the sense layer is reversed in at least two directions by the applied field.

The difference of the resistance of the magnetic tunnel junction during the reading sequence yields the stored state. However, field lines required for reading/writing reduce the scalability of the memory.

Document EP2626860 discloses a MRAM element comprising an aligning device arranged for providing a sense magnetization with a magnetic anisotropy substantially perpendicular a direction of a storage magnetization, and arranged for such that, when a first read magnetic field is provided, a resistance variation range of the MRAM element is at least about 20% of the magnetoresistance.

Document US2012314488 discloses a MRAM cell comprising a field line magnetically coupled to the MRAM cell to induce a magnetic field along a magnetic field axis. At least one of a storage layer and a sense layer of the MRAM cell has a magnetic anisotropy axis that is tilted relative to the magnetic field axis. During a write operation, a storage magnetization direction is switchable between m directions to store data corresponding to one of m logic states, with m>2, where at least one of the m directions is aligned relative to the magnetic anisotropy axis, and at least another one of the m directions is aligned relative to the magnetic field axis.

SUMMARY

The present disclosure concerns a self-referenced MRAM cell comprising a first portion of a magnetic tunnel junction including a storage layer having a storage magnetization; a second portion of the magnetic tunnel junction portion including a tunnel barrier layer and a sense layer having a sense magnetization, the second portion being connected to the first portion such that the tunnel barrier layer is comprised between the storage layer and the sense layer; the second portion further comprising a seed layer in contact with the sense layer and comprising a material having high spin-orbit coupling such that passing a sense current along the plane of the sense layer and/or seed layer exerts a spin-orbit torque adapted for switching the sense magnetization.

The present disclosure further concerns a memory device comprising a plurality of the MRAM cells arranged in rows and columns; the second portion extending along a row, or column, such that the sense current can pass in the seed layer of the second portion when the first and second sense transistors are in the passing mode; a plurality of the first portion being electrically connected along the second portion; a switching transistor electrically connecting in series two adjacent MRAM cells along a column or row sequentially via the first portion and via the second portion, such that a current can pass in the magnetic tunnel junction of the MRAM cells in the column, or row, when the switching transistor is in the passing mode.

Also disclosed is a method for operating the memory device comprising: storing a reference bit included in a set of reference bits in each of said plurality of MRAM cells; presenting a target bit included in a set of target bits in each of said plurality of MRAM cells by passing a sense current having a first polarity for switching a sense magnetization in a first direction and passing the sense current having a second polarity for switching the sense magnetization in a second direction; and comparing the reference bit stored in each of said plurality of MRAM cells with the target bit presented to each of said plurality of MRAM cells such as to determine that the set of target bits matches the stored set of reference bit; wherein said switching the sense magnetization comprises passing the sense current along the plane of the sense layer and/or seed layer, the sense magnetization being switched by the spin-orbit torque exerted on the sense magnetization by the sense current.

Switching the sense magnetization using spin-orbit torque combines the advantages of spin transfer torque (STT) wherein a spin polarized current is passed in the magnetic tunnel junction for switching the magnetization of a ferromagnetic layer. Compared to switching using spin transfer torque, spin-orbit torque switching does not require the use of a polarizing layer. The MRAM cell and memory device does not require field lines for the read and/or write operations and thus can have reduced size.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
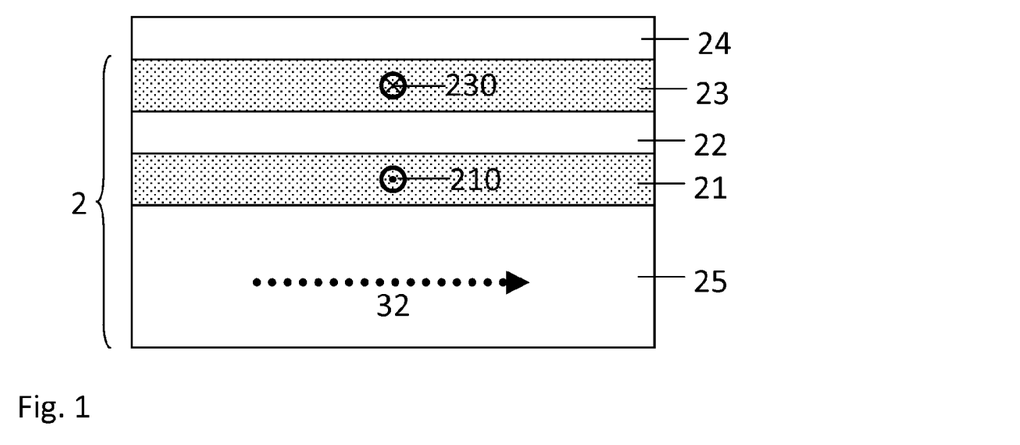
FIG. 1 shows a cross section view of a magnetic tunnel junction according to an embodiment.

FIG. 1 shows a cross section view of a magnetic tunnel junction 2 according to an embodiment. The magnetic tunnel junction 2 includes a ferromagnetic sense layer 21 having a free sense magnetization 210, a storage layer 23 having a storage magnetization 230 and a tunnel barrier layer 22 comprised between the sense layer 21 and the storage layer 23. The storage layer 23 can comprise a ferromagnetic material comprising Co, CoFeB, CoFe or any alloy containing Co, Ni or Fe. The thickness of the storage layer 23 can be comprised between 0.2 nm and 10 nm. The tunnel barrier layer 22 can comprise an oxide such as MgO or AlOx or any suitable oxide yielding high tunnel magnetoresistance (TMR). The thickness of the tunnel barrier layer 22 can be advantageously comprised between 0.2 nm and 3 nm. The magnetic tunnel junction 2 further comprises a seed layer 25 in contact with the sense layer 21.

Figure 4A:
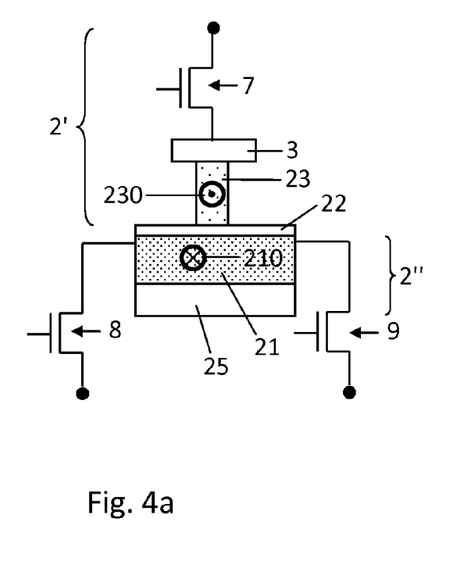
FIG. 4a shows a cross section view of a three terminal, self-referenced MRAM cell according to an embodiment.
Figure 4B:
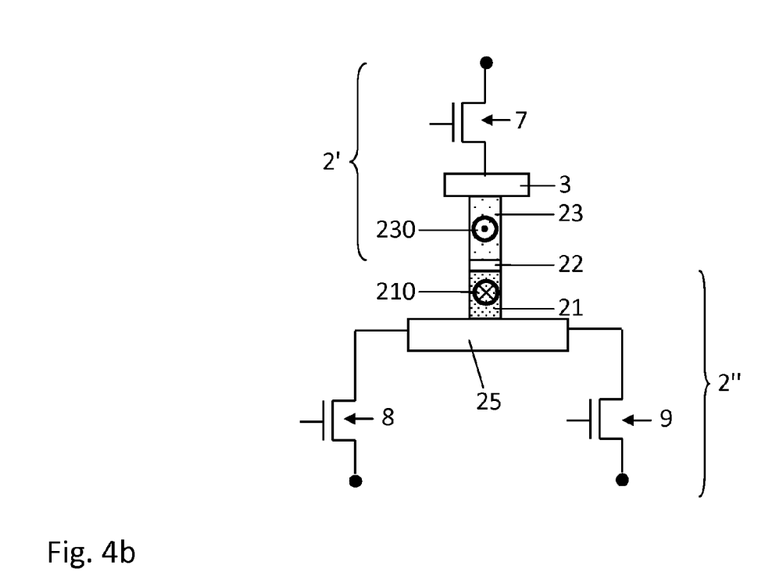
FIG. 4b illustrates a cross section view of the self-referenced MRAM cell, according to another embodiment.
Figure 5:
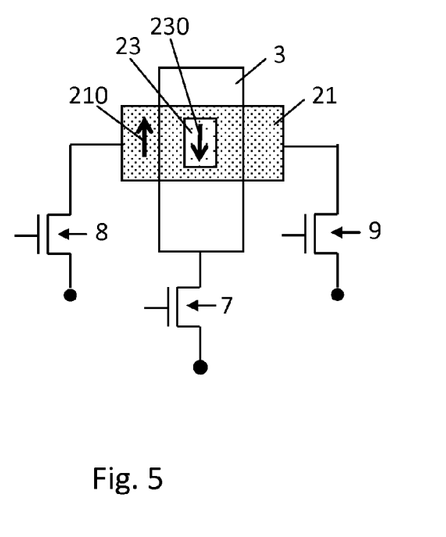
FIG. 5 shows a top view of the MRAM cell, according to an embodiment.

FIG. 4a shows a cross-section view and FIG. 5 shows a top view of a three terminal, self-referenced MRAM cell 1, according to an embodiment. The MRAM cell 1 comprises the magnetic tunnel junction 2 and a current line 3 in electrical communication with one end of the magnetic tunnel junction 2, with the storage layer in the example of FIG. 4a. The MRAM cell 1 further comprises a switching transistor 7 electrically connected to the current line 3, a first sense transistor 8, electrically connected to one end of the sense layer 21, and second sense transistor 9, electrically connected to the other end of the sense layer 21. In the example of FIG. 4a, the storage layer 23 has been etched and is pillar-shaped while the tunnel magnetic barrier 22, sense layer 21 and seed layer 25 are wider. FIG. 4b illustrates the self-referenced MRAM cell 1 where the tunnel magnetic barrier 22 and the sense layer 21 have also been etched such as to be pillar-shaped. In that latter configuration, the first and second sense transistors 8, 9 are electrically connected to each ends of the seed layer 25. The seed layer 25 can also be partially etched.

According to an embodiment, a read operation of the MRAM cell comprises the steps of:

switching the sense magnetization 210 in a first direction;

measuring a first resistance R1 of the magnetic tunnel junction 2;

switching the sense magnetization 210 in a second direction opposed to the first direction; and measuring a second resistance R2 of the magnetic tunnel junction 2.

Switching the sense magnetization 210 is performed using spin-orbit torque switching. Spin-orbit torque switching occurs by passing a sense current 32 along the plane of the sense layer 21 and/or the seed layer 25. Compared to switching using spin transfer torque (STT), spin-orbit torque switching does not require the use of a polarizing layer.

Figure 2:
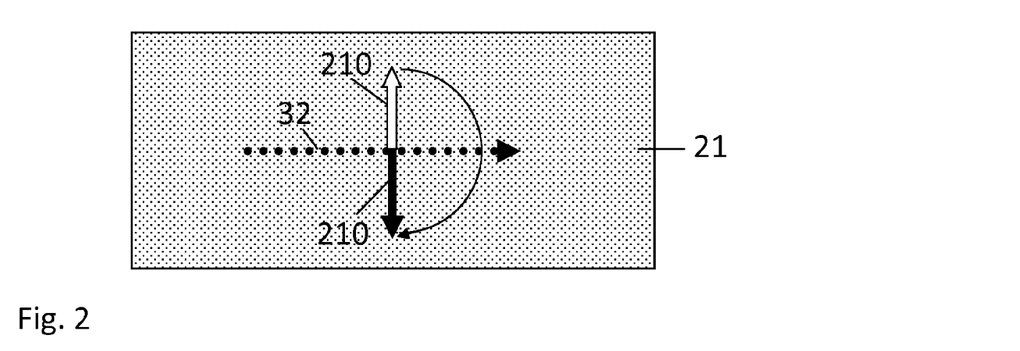
FIG. 2 shows a top view of the magnetic tunnel junction according to an embodiment.

Spin-orbit torque switching is schematically illustrated in FIG. 2. FIG. 2 shows a top view of the magnetic tunnel junction 2 of FIG. 1 with the sense magnetization 210 being oriented along the plane of the sense layer 21 (in-plane). In the example of FIG. 2, the sense magnetization 210 is initially oriented upwards (white-filled arrow in FIG. 2 and also represented entering the page in FIG. 1) and switched downwards by passing the sense current 32 (represented by the arrowhead symbol in FIG. 1 and the black-filled arrow in FIG. 2). The sense current 32 is represented flowing towards the right of the page by the dotted arrow in FIGS. 1 and 2. The sense current 32 can be passed along the plane of the sense layer 21 or along the plane of the seed layer 25, or along the plane of both the sense and seed layers 21, 25.

Figure 3:
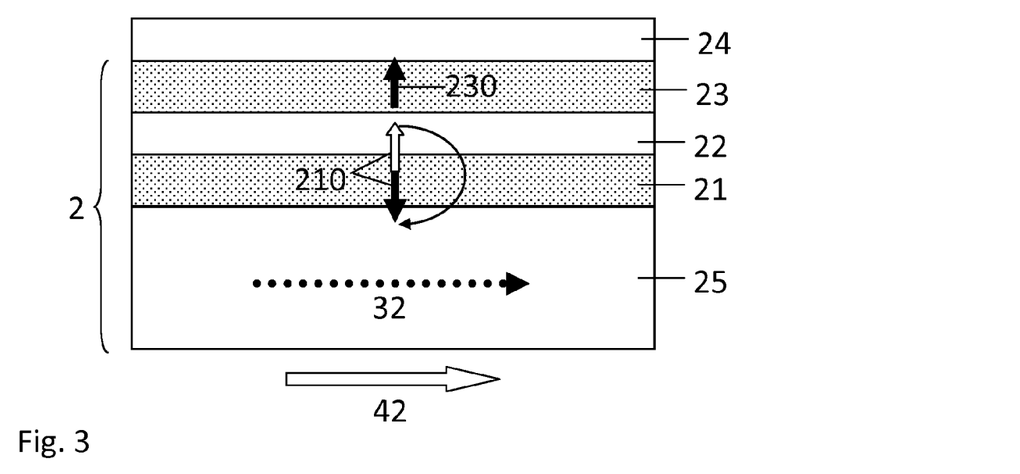
FIG. 3 shows a cross section view of a magnetic tunnel junction according to an embodiment.

FIG. 3 shows the same cross section view a side view of the magnetic tunnel junction 2 as the one of FIG. 1 where the sense magnetization is oriented substantially perpendicular to the plane of the sense layer 21 (out-of-plane). In this configuration, passing the sense current 32 switches the sense magnetization 210 from the initial direction, oriented upwards in the example of FIG. 3 (white-filled arrow), to a switched direction oriented downwards (black-filled arrow). In the out-of-plane configuration of FIG. 3, a magnetic field 42 can be applied in addition to the sense current 32 for orienting the sense magnetization 210 such that the spin-orbit torque is exerted in the appropriate direction in order to achieve switching of the sense layer 210. That magnetic field can be generated by a field line or magnetic material deposited in the vicinity of the sense layer 210.

The switching direction of the sense magnetization 210 is determined by the injected current direction and the nature of the seed layer. In particular, the switching direction of the sense magnetization 210 is determined by the spin-orbit coupling of the material of the seed layer 25. Advantageously, the seed layer 25 comprises a material having high spin-orbit coupling. Such material can comprise any one or a combination of elements selected from Ta, Pt, Pd, Au, Bi, Zn, Hf, Os, Pb, Tl, W, Tb, Gd, Ho, Dy, Pr, Sm, Nd, V, Ti, Te or Ir, or any other suitable material having high spin-orbit coupling. Alternatively, the high spin-coupling material can comprise a low spin-orbit material such as Cu, Si, Al, Mg or C being doped with any one or a combination of the elements above.

Figure 7:
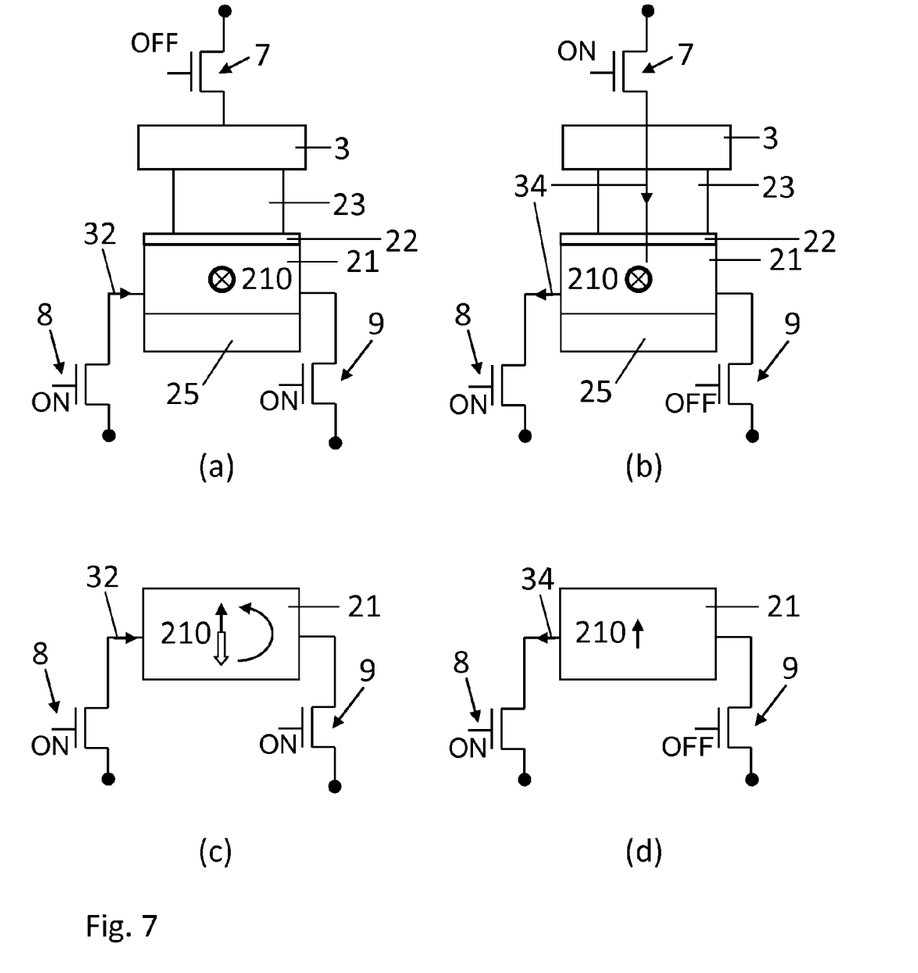
FIG. 7 illustrates a read operation of the MRAM cell, according to an embodiment.

FIG. 7 illustrates the read operation for the in-plane configuration of the sense magnetization 210, according to an embodiment. In particular, FIGS. 7a and 7b show a cross-section view of the MRAM cell 1 and FIGS. 7c and 7d show a top view of the MRAM cell 1. In FIGS. 7c and 7d, the tunnel barrier 22, storage layer 23, current line 3 and switching transistor 7 are not shown for sake of simplicity.

FIGS. 7a and 7c show switching of the sense magnetization 210 from an initial direction (shown by the white-filled arrow pointing downwards in FIG. 7c) to a first switched direction opposed to the initial direction (shown by the black-filled arrow in FIG. 7c and the arrow tail symbol in FIG. 7a). The switching is performed by passing the sense current 32 having a first polarity along the plane of the sense layer 21 (FIG. 7a) by setting the first and second sense transistors 8, 9 in the passing mode (ON). The sense current 32 flows substantially perpendicular to the sense magnetization 210.

Measuring the first resistance R1 can be performed by passing a read current 34 in the magnetic tunnel junction 2 via the current line 3 when the switching transistor 7 and one of the sense transistors 8, 9 is in the passing mode (FIGS. 7b and 7d).

The sense magnetization 210 is then switched in the second direction by applying the sense current 32 with a second polarity opposed to the first polarity, along the plane of the sense layer 21. The direction of the sense current 32 being opposed to the one shown in FIGS. 7a and 7c, and the initial and switched directions of the sense magnetization 210 corresponding, respectively, to the black-filled arrow and the white-filled arrow in FIG. 7c. Measuring the second resistance R2 can be performed by passing the read current 34 in the magnetic tunnel junction 2 via the current line 3 when the switching transistor 7 and one of the sense transistors 8, 9 is in the passing mode. Here, the switched direction of the sense magnetization 210 is oriented opposed to the direction shown in FIGS. 7b and 7d.

The first and second resistances R1, R2 then can be compared. The difference between the first and second (R1-R2) yields the direction of the storage magnetization 230 and thus of the stored written state.

Figure 8:
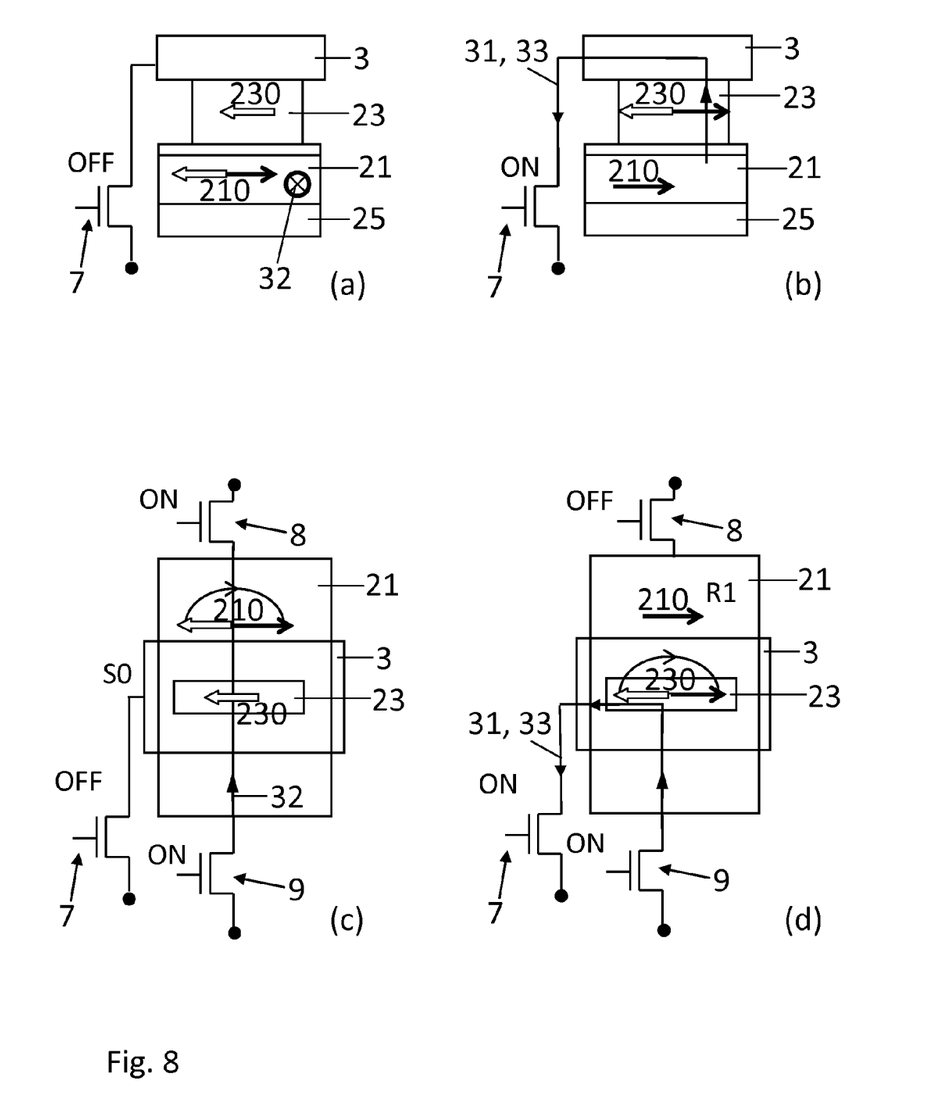
FIG. 8 illustrates a write operation of the MRAM cell according to an embodiment.

FIG. 8 illustrates a write operation of the MRAM cell 1 according to an embodiment. In particular, FIGS. 8a and 8b show a cross-section view of the MRAM cell 1 and FIGS. 8c and 8d show a top view of the MRAM cell 1. In FIGS. 8a and 8b, the MRAM cell 1 is represented according to a view that is perpendicular to the one of FIG. 7. In this representation, the first and second sense transistors 8, 9 that should appear in front and behind the MRAM cell 1 are not represented for sake of clarity.

The write operation comprises the step of switching the storage magnetization 230 by passing a spin-polarized write current 31 in the magnetic tunnel junction 2. The spin-polarized write current 31 can be passed in the magnetic tunnel junction 2 via the current line 3 by setting the switching transistor 7 to the passing mode (see FIGS. 8b and 8d).

The electrons of the write current 31 become polarized when passing through the ferromagnetic sense layer 21, in accordance with the current flow direction. When the amplitude of this spin-polarized write current is sufficient, the spins of the write current 31 are capable of switching the direction of the storage magnetization 230 by transfer of the angular spin moment between the spin-polarized carriers (electrons) and the magnetic moment of the first storage layer 23. This transfer of the angular spin is also known under the expression "spin transfer torque (STT)".

In the configuration of FIGS. 8b and 8d, where the sense magnetization 210 is oriented according to the in-plane configuration, the electrons of the write current 31 are polarized by the sense layer 21 with a direction substantially parallel to the plane of the storage layer 23. The storage magnetization 230 is switched due to the spin transfer torque exerted by the write current 31 in an orientation that depends on the polarity of the write current 31 and on the predetermined initial direction of the sense magnetization 210.

In the case of the out-of-plane configuration of FIG. 3, the electrons of the write current 31 are polarized by the sense layer 21 having a direction substantially perpendicular to the plane of the storage layer 23.

In a variant, the direction of the switched storage magnetization 230 is determined by selecting the polarity of the spin-polarized write current 31.

In another variant, the direction of the switched storage magnetization 230 is determined by a predetermined direction of the sense magnetization 210 (assuming that the polarity of the write current 31 remains unchanged). Switching the sense magnetization 210 in the predetermined direction can be performed using spin-orbit torque switching, by passing the sense current 32 having a predetermined polarity along the plane of the ferromagnetic sense layer 21. In FIGS. 8a and 8c the sense current 32 is represented flowing in a direction entering the page and perpendicular to the sense magnetization 210 with the first and second sense transistors 8, 9 being in the passing mode. The sense current 32 switches the sense magnetization 210 from an initial direction (shown by the white-filled arrow in FIGS. 8a and 8c) to the predetermined direction (shown by the black-filled arrow in FIGS. 8a and 8c), in accordance with the polarity of the sense current 32. During switching the sense magnetization 210, the orientation of the storage magnetization 230 remain unchanged. The write current 31 then switches the storage layer magnetization 230, transistors 7 and 8, or 7 and 9, being in the passing mode.

In an embodiment, the storage layer 23 can be configured such that the storage magnetization 230 is pinned at a low temperature threshold and is free at a high temperature threshold. Such configuration of the storage layer 23 allows for better stability of the switched storage magnetization 230. In a variant, the storage layer 23 has high intrinsic anisotropy.

In another variant, the magnetic tunnel junction 2 further comprises an antiferromagnetic storage layer 24 exchange-coupling the storage layer 23 such as to pin the storage magnetization 230 at the low threshold temperature and to free it at the high threshold temperature. The antiferromagnetic storage layer 24 can comprise IrMn, FeMn, PtMn or any other suitable antiferromagnetic material.

In this latter configuration, the write operation can further comprise a step of passing a heating current 33 in the magnetic tunnel junction 2 such as to heat it at the high temperature threshold and free the storage magnetization 230. The heating current 33 can be passed in the magnetic tunnel junction 2 via the current line 3 by setting the switching transistor 7 to the passing mode (see FIGS. 8b and 8d). Once the magnetic tunnel junction 2 has reached the high temperature threshold, the storage magnetization 230 can be switched by passing the spin-polarized write current 31 in the magnetic tunnel junction 2. After switching the storage magnetization 230, the magnetic tunnel junction 2 can be cooled down to the low temperature threshold such as to freeze the storage magnetization 230 in the switched orientation. Cooling the magnetic tunnel junction 2 is achieved by inhibiting the heating current, for example by setting the switching transistor 7 to the blocking mode.

Figure 9:
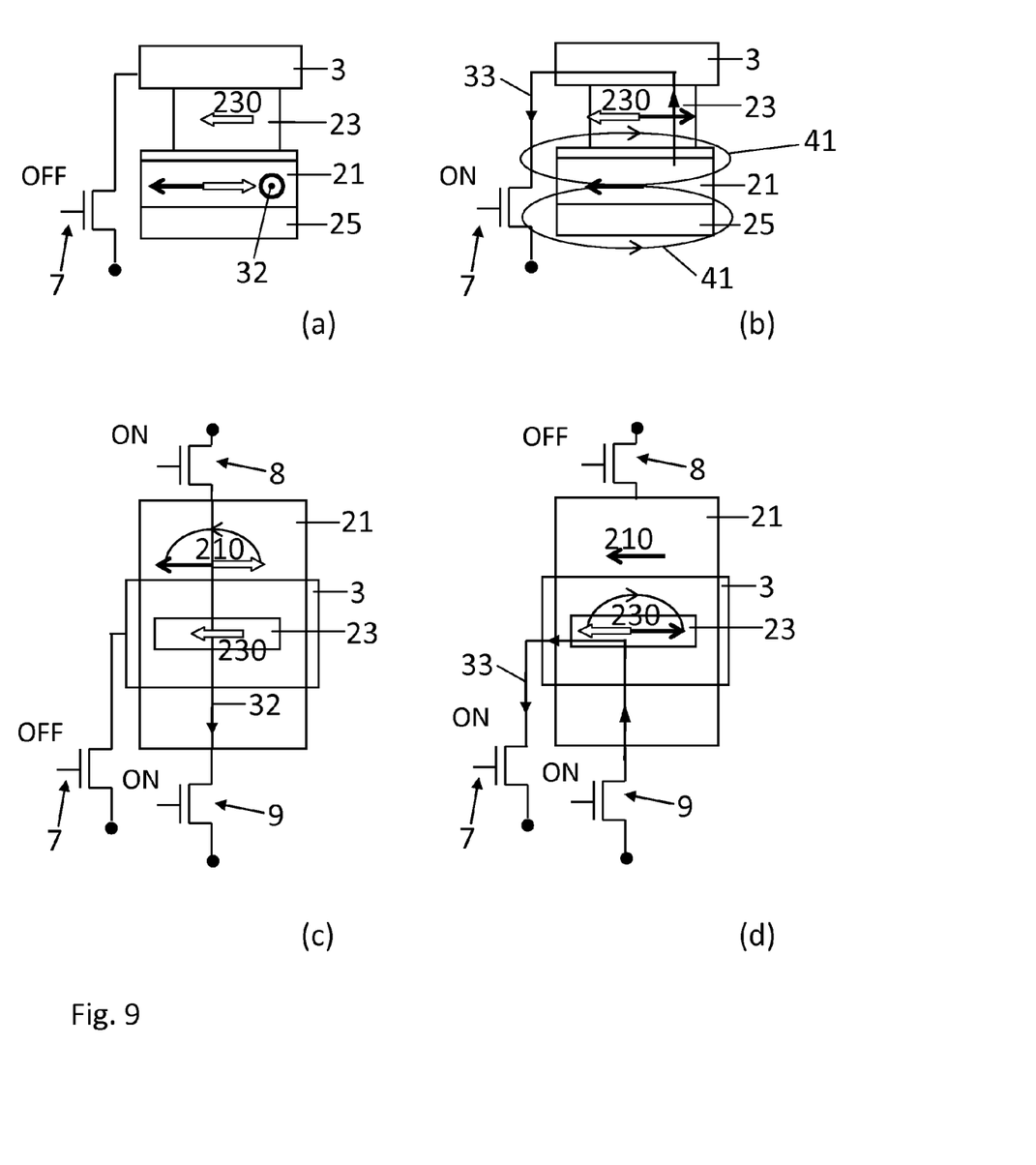
FIG. 9 illustrates a write operation of the MRAM cell according to another embodiment.

FIG. 9 illustrates the write operation of the MRAM cell 1 using a thermally induced dipolar switching, according to another embodiment. Similarly to FIG. 8, FIGS. 9a and 9b show a cross-section view of the MRAM cell 1 and FIGS. 9c and 9d show a top view of the MRAM cell 1.

According to this embodiment, the storage layer 23 is configured such that, at the high temperature threshold, the storage magnetization 230 can be switched due to magnetostatic interaction with the sense layer 21. The storage magnetization 230 is switched in a direction corresponding to the orientation of the predetermined direction of the sense magnetization 210. The write operation thus comprises the steps of:

switching the sense magnetization 210 in the predetermined direction; and heating the magnetic tunnel junction 2 to the high temperature threshold.

Switching the sense magnetization 210 in the predetermined direction can be performed by passing the sense current 32 having a predetermined polarity along the plane of the sense layer 21, as discussed above. FIGS. 9a and 9c illustrate the sense current 32 entering the page and substantially perpendicular to the sense magnetization 210, when the first and second sense transistors 8, 9 are in the passing mode. The sense magnetization 210 is switched from an initial direction (white-filled arrow in FIGS. 9a and 9c) to the predetermined direction (black-filled arrow in FIGS. 9a and 9c) opposed to the initial direction.

Heating the magnetic tunnel junction 2 comprises passing the heating current 33 in the magnetic tunnel junction 2 via the current line 3 by setting the switching transistor 7 and transistors 8 or 9 to the passing mode. FIGS. 9b and 9d show the storage magnetization 230 prior to heating the magnetic tunnel junction 2 (white-filled arrow) and after being switched (black-filled arrow).

Dipolar coupling between the sense layer 21 and the storage layer 23 occurs due to local magnetic stray field coupling the sense magnetization 210 to the storage magnetization 230 in a closed magnetic flux configuration 41 shown in FIG. 9b. At the low temperature threshold, the storage magnetization 230 is pinned and thus remains fixed. At the high temperature threshold, the storage magnetization 230 can be oriented by the local magnetic stray field 41.

After switching of the storage magnetization 230, the magnetic tunnel junction 2 can be cooled to the low temperature threshold such as to freeze the storage magnetization 230 in the switched direction (written state).

Figure 6A:
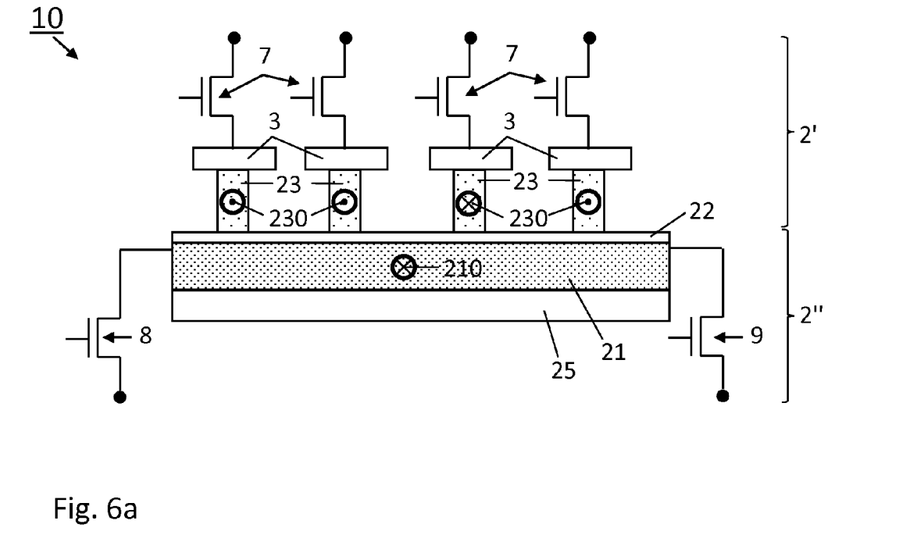
FIG. 6a shows a memory device comprising a plurality of the MRAM cell 1, according to an embodiment.

FIG. 6a shows a memory device 10 comprising a plurality of the MRAM cell 1, according to an embodiment. In the particular configuration of FIG. 6a, the memory device 10 comprises a plurality of a first portion 2' of the magnetic tunnel junction 2 arranged in a row (or column) and connected to a single second portion 2" of the magnetic tunnel junction 2. Here, the first portion 2' comprises the storage layer 23, current line 3 and switching transistor 7, and the second portion 2" comprises the sense layer 21, tunnel barrier layer 22, seed layer 25 and the first and second sense transistors 8, 9 respectively connected at each end of the second portion 2". The configuration of the memory device 10 shown in FIG. 6a allows for reduced reading consumption.

Figure 6B:
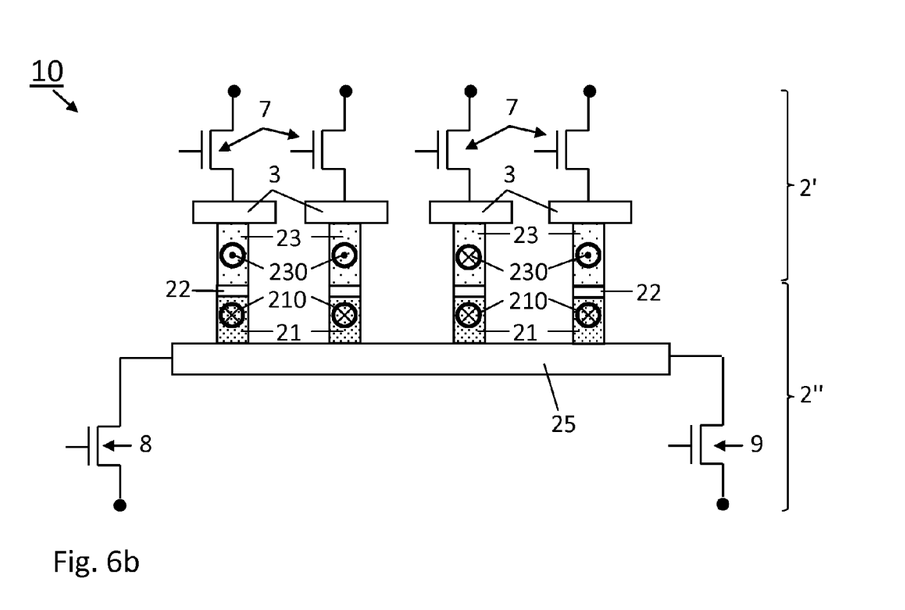
FIG. 6b illustrates the memory device, according to another embodiment.

FIG. 6b illustrates a variant of the memory device 10, where the storage layer 23, tunnel magnetic barrier 22, sense layer 21 and seed layer 25 have been etched such as to be pillar-shaped. The first and second sense transistors 8, 9 are electrically connected to each ends of the seed layer 25.

In an embodiment not represented, the memory device 10 comprises a plurality of the MRAM cell 1 as shown in FIG. 2 arranged in rows and columns.

Figure 10:
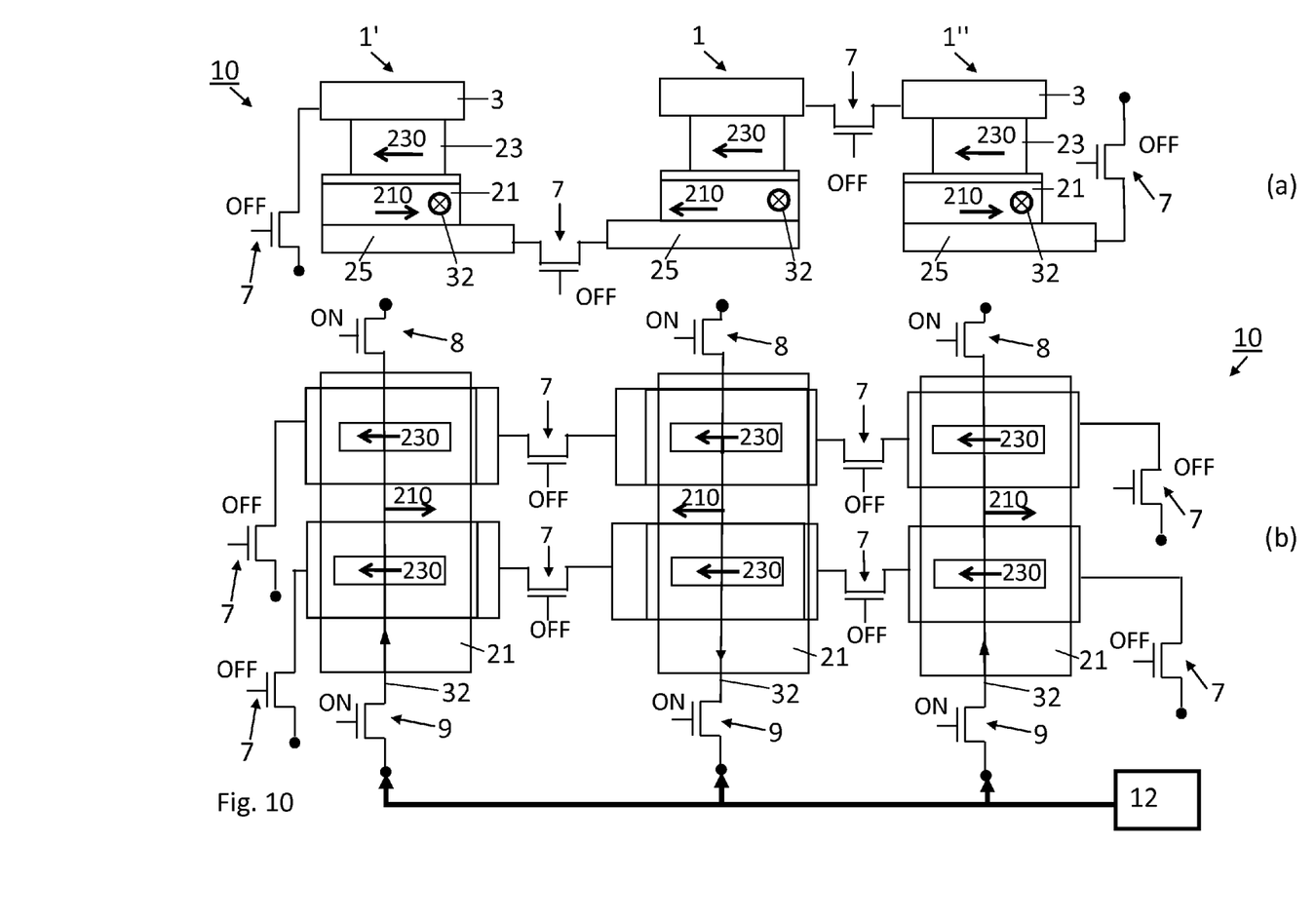
FIG. 10 shows the memory device used as authentication device during a first step of a write operation and a first step of a read operation, according to an embodiment.
Figure 11:
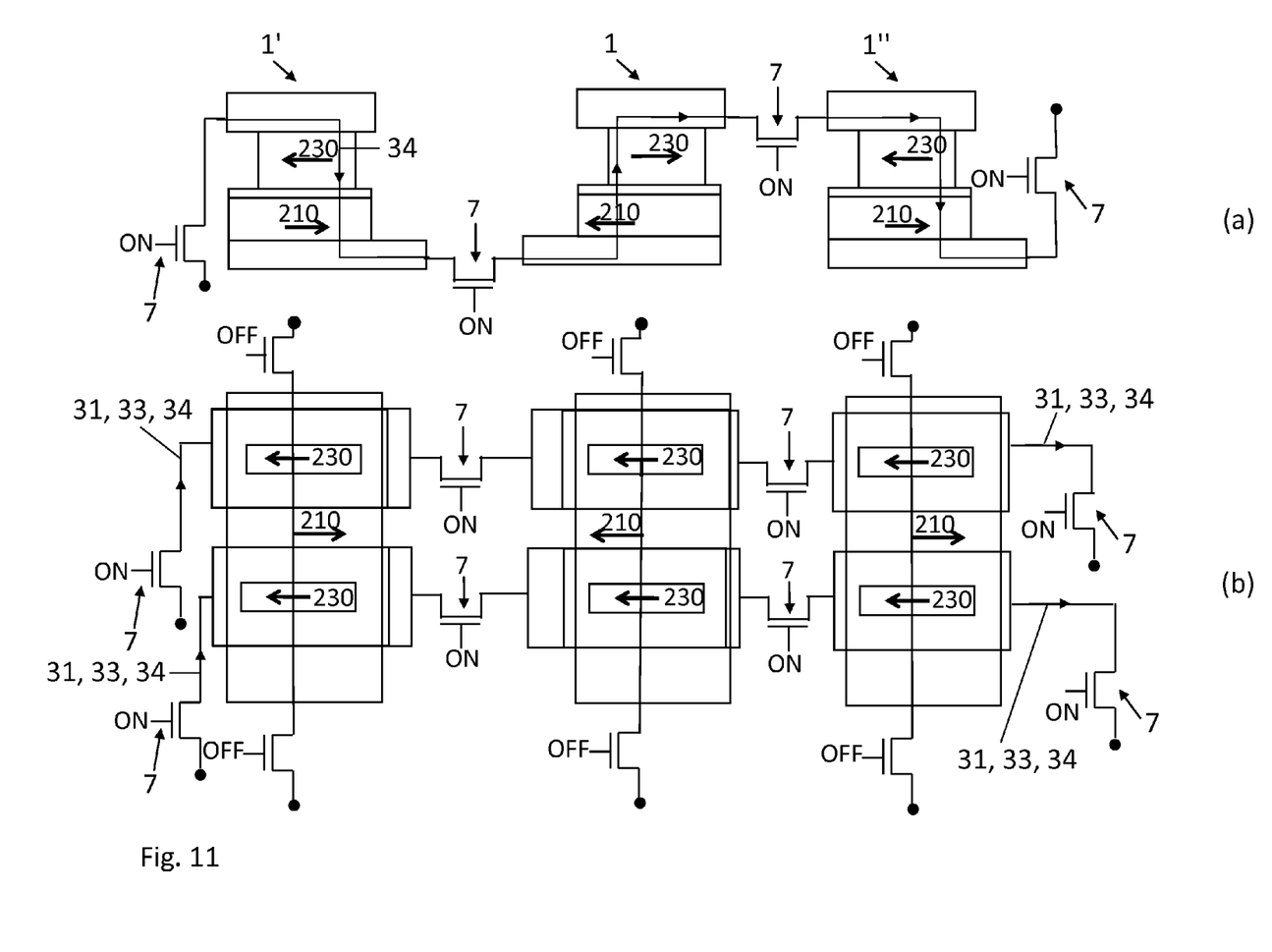
FIG. 11 shows the memory device used as authentication device during a second step of the write operation and a second step of the read operation, according to an embodiment.

FIGS. 10 and 11 show the memory device 10 according to another embodiment, wherein each MRAM cells 1 in a row is electrically connected in series with another MRAM cell 1 in the adjacent row via the switching transistor 7. More particularly, FIGS. 10a and 11a are a cross-section view of the memory device 10 and FIGS. 10b and 11b show a top view of the memory device 10.

In the example of FIGS. 10 and 11, the memory device 10 comprises two NAND chains of three MRAM cells 1, wherein a plurality of the first portion 2' is electrically connected along the second portion 2"; the second portion 2" extending along a row, or column of the device 10. The switching transistor 7 electrically connects two adjacent MRAM cells 1 in a column or row, sequentially via the first portion 2' and via the second portion 2". This configuration allows the write current 31, heating current 33 and read current 34 passing in the magnetic tunnel junction 2 of all the MRAM cells 1 in the column, or row, when the switching transistors 7 are in the passing mode. Moreover, the first sense transistor 8 is electrically connected to one end of the second portion 2" and the second sense transistor 9 is electrically connected to the other end of the single second portion 2", such that the sense current 32 can pass in the seed layer 25 of the second portion 2", along the plane of the sense layer 21, when the first and second sense transistors 8, 9 are in the passing mode.

It is understood that the present teaching will equally apply to the memory device 10 comprising any other number of MRAM cells 1.

In an embodiment, the memory device 10 can be used as authentication device or content addressable memory and is configured to store information in the form of a reference pattern (in the form of a chain of bits). The stored reference pattern can be compared with an inputted pattern 12 entered for or by a user with the stored reference pattern. Comparison of the inputted pattern 12 with the stored reference pattern can yield a "yes" or "no" matching level. Such memory device 10 can be used for example for authentication of a pin code, a biometric print, or a secure private key.

In an embodiment illustrated in FIGS. 10 and 11, a method for operating the memory device 10 comprises the steps of:

storing a reference bit included in a set of reference bits 12 in each of said plurality of MRAM cells 1;

presenting a target bit included in a set of target bits 12' in each of said plurality of MRAM cells 1, and comparing the set of target bits 12' to the set of reference bits 12, i.e., comparing the reference bit stored in each of said plurality of MRAM cells (1) with the target bit presented to each of said plurality of MRAM cells (1), such as to determine that the set of target bits 12' matches the stored set of reference bits 12.

In an embodiment, storing a reference bit comprises setting the switching transistors 7 in the passing mode for passing the spin polarized write current 31 and/or heating current 33 in the magnetic tunnel junction 2 such as to switch the storage magnetization 230 (see FIG. 11). The first and second sense transistors 8, 9 are set to the blocking mode. The storage magnetization 230 is switched in a direction that is determined by the polarity of the spin-polarized write current 31 and by the direction of the sense magnetization 210.

In a variant, the direction of the switched storage magnetization 230 is determined by switching the sense magnetization 210 in a predetermined direction prior to storing the reference bit by passing the sense current 32 as described above (see FIG. 10).

In another variant, the magnetic tunnel junction 2 further comprises an antiferromagnetic storage layer 24; and the heating current 33 is passed in the magnetic tunnel junction 2 such as to heat it at a high temperature threshold (see FIG. 11).

In another embodiment, the storage layer 23 is configured such that the storage magnetization 230 is switchable due to magnetostatic interaction with the sense layer 21 when the magnetic tunnel junction 2 is at a high temperature threshold; and storing a reference bit comprises heating the magnetic tunnel junction 2 at the high temperature threshold such as to switch the storage magnetization 230.

In an embodiment, presenting a target bit comprises setting the first and second sense transistors 8, 9 in the passing mode for passing the sense current 32 in the seed layer 25 and/or in the sense layer 21 along the plane of the sense layer 21, such as to switch the sense magnetization 210 (see FIG. 10). During this step, the switching transistors 7 are set to the closed mode. The sense magnetization 210 is switched due to spin-orbit torque as described above.

In the in-plane configuration, the sense magnetization 210 is switched in a direction substantially parallel to the plane of the sense layer 21. Conversely, in the out-of-plane configuration, the sense magnetization 210 is switched in a direction substantially perpendicular to the plane of the sense layer 21.

In an embodiment, comparing the set of target bits 12' to the set of reference bits 12 is performed by setting the switching transistors 7 in the passing mode for passing a read current 34 in the magnetic tunnel junction 2 such as to measure a resistance R of the magnetic tunnel junction 2 (see FIG. 11). The first and second sense transistors 8, 9 are set to the closed mode.

In the case where the target bit in each the MRAM cells 1 matches the corresponding reference bit, i.e., in the case where the sense magnetization 210 in each the MRAM cells 1 is oriented in the same direction as the storage magnetization 230 in the corresponding MRAM cell 1, the total resistance $R_{TOT}$, measured for all the MRAM cells 1 in the memory device 10 is minimal or maximal, depending on the adopted convention. Here, the total resistance $R_{TOT}$ is the sum of the resistance R of each MRAM cells 1 in the memory device 10. In other words, the total resistance $R_{TOT}$ being minimal or maximal, depending on the adopted convention, corresponds to the set of target bits 12' matching the set of reference bits 12.

In the case the set of target bits 12' does not match the set of reference bits 12, the total resistance $R_{TOT}$ is not minimal or maximal, depending on the adopted convention.

In another embodiment, presenting a target bit comprises the steps of passing the sense current 32 having a first polarity such as to switch the sense magnetization 210 in a first direction; measuring a first resistance R1 of the magnetic tunnel junction 2; passing the sense current 32 having a second polarity such as to switch the sense magnetization 210 in a second direction; and measuring a second resistance R2 of the magnetic tunnel junction 2. As above, the sense current 32 is passed in the seed layer 25 along the plane of the sense layer 21. Comparing the set of target bits 12' to the set of reference bits 12 is then performed by determining the difference between the first and second resistance R1, R2 for each MRAM cell 1 of the memory device 10. Alternatively, comparing the set of target bits 12' to the set of reference bits 12 can comprise comparing the total resistance $R_{TOT}$ to a reference resistance.

REFERENCE NUMBERS AND SYMBOLS 1 self-referenced MRAM cell
1' first MRAM cell
1" last MRAM cell
2 magnetic tunnel junction
2' first portion
2" second portion
3 current line
7 switching transistor
8 first sense transistor
9 second sense transistor
10 memory device
12 set of reference bits
12' set of target bits
21 sense layer
210 sense magnetization
22 tunnel barrier layer
23 storage layer
230 storage magnetization
24 antiferromagnetic storage layer
25 seed layer
31 spin-polarized current
32 sense current
33 heating current
34 read current
41 magnetic stray field
42 magnetic field
R resistance of the magnetic tunnel junction
R1 first resistance
R2 second resistance
$R_{TOT}$ total resistance

What is claimed is:

1. A self-referenced MRAM cell comprising:
a first portion of a magnetic tunnel junction including a storage layer having a storage magnetization;
a second portion of the magnetic tunnel junction portion including a tunnel barrier layer and a sense layer having a sense magnetization, the second portion being connected to the first portion such that the tunnel barrier layer is comprised between the storage layer and the sense layer;
the second portion further comprising a seed layer in contact with the sense layer and comprising a material having high spin-orbit coupling such that passing a sense current along the plane of the sense layer and/or seed layer exerts a spin-orbit torque adapted for switching the sense magnetization; and
a switching transistor electrically connected to the storage layer, a first sense transistor electrically connected to one end of the sense layer and second sense transistor electrically connected to the other end of the sense layer;
wherein the MRAM cell is configured to be set in a write operation mode by setting the switching transistor and one of the first and second sense transistor to the passing mode such as to pass a spin-polarized write current in the magnetic tunnel junction.

2. The MRAM cell according to claim 1, wherein the high spin-coupling material comprises any one or a combination of elements selected from Ta, Pt, Pd, Au, Bi, Zn, Hf, Os, Pb, Tl, W, Tb, Gd, Ho, Dy, Pr, Sm, Nd, V, Ti, Te or Ir.

3. The MRAM cell according to claim 1, wherein the high spin-coupling material comprises a low spin-orbit material doped with a high spin-coupling material comprising any one or a combination of elements selected from Ta, Pt, Pd, Au, Bi, Zn, Hf, Os, Pb, Tl, W, Tb, Gd, Ho, Dy, Pr, Sm, Nd, V, Ti, Te or Ir.

4. The MRAM cell according to claim 3, wherein the low spin-orbit material comprises any one or a combination of elements selected from Cu, Si, Al, Mg or C.

5. The MRAM cell according to claim 1, wherein the sense magnetization is aligned substantially parallel or perpendicular to the plane of the sense layer.

6. A memory device comprising a plurality of MRAM cells arranged in rows and columns; each MRAM cell comprising a first portion of a magnetic tunnel junction including a storage layer having a storage magnetization; a second portion of the magnetic tunnel junction portion including a tunnel barrier layer and a sense layer having a sense magnetization, the second portion being connected to the first portion such that the tunnel barrier layer is comprised between the storage layer and the sense layer; the second portion further comprising a seed layer in contact with the sense layer and comprising a material having high spin-orbit coupling such that passing a sense current along the plane of the sense layer and/or seed layer exerts a spin-orbit torque adapted for switching the sense magnetization;

the second portion extending along a row, or column with a first sense transistor being electrically connected to one end of the second portion and a second sense transistor being electrically connected to the other end of the single second portion, such that the sense current can pass along the plane of the sense layer and/or seed layer when the first and second sense transistors are in the passing mode;

a plurality of the first portion being electrically connected along the second portion; and a switching transistor electrically connecting in series two adjacent MRAM cells along a column or row, sequentially via the first portion and via the second portion, such that a current can pass in the magnetic tunnel junction of the MRAM cells in the column, or row, when the switching transistor is in the passing mode.

7. Method for operating a memory device comprising a plurality of MRAM cells arranged in rows and columns, each MRAM cell comprising a first portion of a magnetic tunnel junction including a storage layer having a storage magnetization; a second portion of the magnetic tunnel junction portion including a tunnel barrier layer and a sense layer having a sense magnetization, the second portion being connected to the first portion such that the tunnel barrier layer is comprised between the storage layer and the sense layer; the second portion further comprising a seed layer in contact with the sense layer and comprising a material having high spin-orbit coupling such that passing a sense current along the plane of the sense layer and/or seed layer exerts a spin-orbit torque adapted for switching the sense magnetization; the second portion extending along a row, or column, with a first sense transistor being electrically connected to one end of the second portion and a second sense transistor being electrically connected to the other end of the single second portion, such that the sense current can pass along the plane of the sense layer and/or seed layer when the first and second sense transistors are in the passing mode; a plurality of the first portion being electrically connected along the second portion; and a switching transistor electrically connecting in series two adjacent MRAM cells along a column or row, sequentially via the first portion and via the second portion, such that a current can pass in the magnetic tunnel junction of the MRAM cells in the column, or row, when the switching transistor is in the passing mode, the method comprising:

storing a reference bit included in a set of reference bits in each of said plurality of MRAM cells;

presenting a target bit included in a set of target bits in each of said plurality of MRAM cells;

comparing the reference bit stored in each of said plurality of MRAM cells with the target bit presented to each of said plurality of MRAM cells such as to determine that the set of target bits matches the stored set of reference bits;

said presenting a target bit comprising passing the sense current having a first polarity along the plane of the sense layer and/or seed layer for switching the sense magnetization in a first direction and passing the sense current having a second polarity along the plane of the sense layer and/or seed layer for switching the sense magnetization in a second direction;

said switching the sense magnetization comprising passing the sense current along the plane of the sense layer and/or seed layer, the sense magnetization being switched by the spin-orbit torque exerted on the sense magnetization by the sense current.

8. The method according to claim 7, wherein said storing a reference bit comprises switching the storage magnetization by passing a write current in the magnetic tunnel junction.

9. The method according to claim 8, wherein said write current comprises a spin polarized write current.

10. The method according to claim 9, wherein a direction of the switched storage magnetization is determined by selecting a polarity of the spin-polarized current or by switching the sense magnetization in a predetermined direction.

11. The method according to claim 7, wherein
the storage layer is configured such that the storage magnetization is switchable due to magnetostatic interaction with the sense layer when the magnetic tunnel junction is at a high temperature threshold; and
wherein said write current comprises a heating current being passed in the magnetic tunnel junction such as to heat the magnetic tunnel junction at the high temperature threshold.

12. The method according to claim 7, wherein the sense magnetization is switched in a direction substantially parallel to the plane of the sense layer or in a direction substantially perpendicular to the plane of the sense layer.

13. The method according to claim 12, wherein said comparing the reference bit comprises either:
measuring a first resistance when the sense magnetization is switched in the first direction, and measuring a second resistance when the sense magnetization is switched in the second direction, by passing a read current in the magnetic tunnel junction; or
comparing a total resistance measured for said plurality of MRAM cells to a reference resistance.

* * * * *